(12) United States Patent
Schild et al.

(10) Patent No.: US 9,362,900 B2
(45) Date of Patent: Jun. 7, 2016

(54) CIRCUIT FOR THE ARITHMETIC LINKING OF SEVERAL INPUT SIGNALS

(71) Applicant: Rohde & Schwarz GmbH & Co. KG, Munich (DE)

(72) Inventors: Alexander Schild, Feldkirchen (DE); Alexander Kunze, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 131 days.

(21) Appl. No.: 14/081,134

(22) Filed: Nov. 15, 2013

(65) Prior Publication Data

US 2014/0132330 A1    May 15, 2014

(30) Foreign Application Priority Data

Nov. 15, 2012    (DE) .......................... 10 2012 220 849

(51) Int. Cl.
*H03K 17/041*    (2006.01)

(52) U.S. Cl.
CPC .... *H03K 17/04106* (2013.01); *H03K 17/04113* (2013.01)

(58) Field of Classification Search
CPC ................... H03K 17/04106; H03K 17/04113
USPC ........ 327/347–361, 365; 712/211, 10, 32, 35, 712/11
See application file for complete search history.

(56) References Cited

U.S. PATENT DOCUMENTS

| 3,069,086 | A  | * | 12/1962 | Papo ........................ G06F 7/386 307/415 |
| 7,408,406 | B2 | * | 8/2008  | Hickman ................ H03F 3/211 330/147 |

FOREIGN PATENT DOCUMENTS

EP    2 022 169 B1    4/2010

OTHER PUBLICATIONS

Le Tual, Stephane et al., A 3GS/s. 9b, 1.2V single supply, pure binary DAC with >50dB SFDR up to 1.5GHz in 65nm CMOS. In:2011 Symposium on VLSI Circuits Digest of Technical Papers, S. 64-65.

* cited by examiner

*Primary Examiner* — Dinh Le
(74) *Attorney, Agent, or Firm* — Carter, DeLuca, Farrell & Schmidt, LLP

(57) ABSTRACT

A switching unit serves for the arithmetic linking of at least two input signals supplied to the switching unit. For this purpose, the switching unit provides a switching matrix to which the at least two input signals are supplied. The switching matrix applies at least one summation operation to at least two input signals and/or at least one multiplication operation to at least one input signal. Additionally or alternatively, the switching matrix can also connect at least one input signal directly through to a first output. The switching matrix comprises for this purpose several current switches.

20 Claims, 7 Drawing Sheets

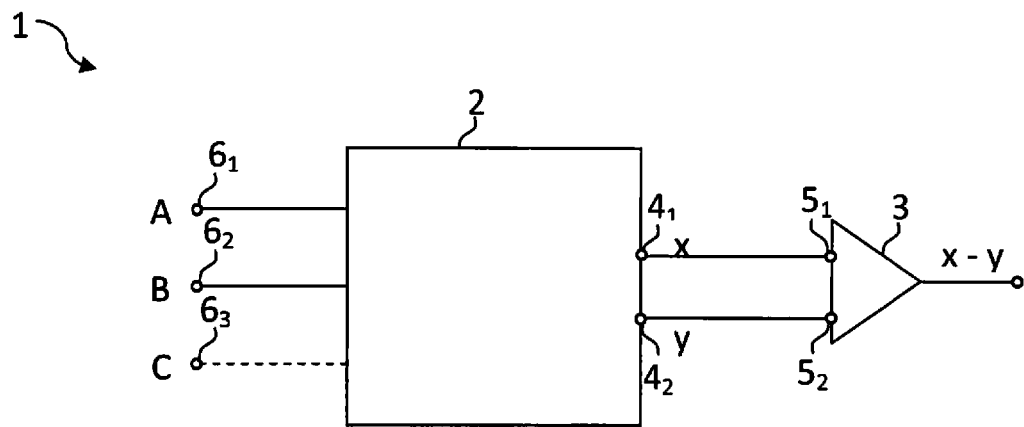
Fig. 1
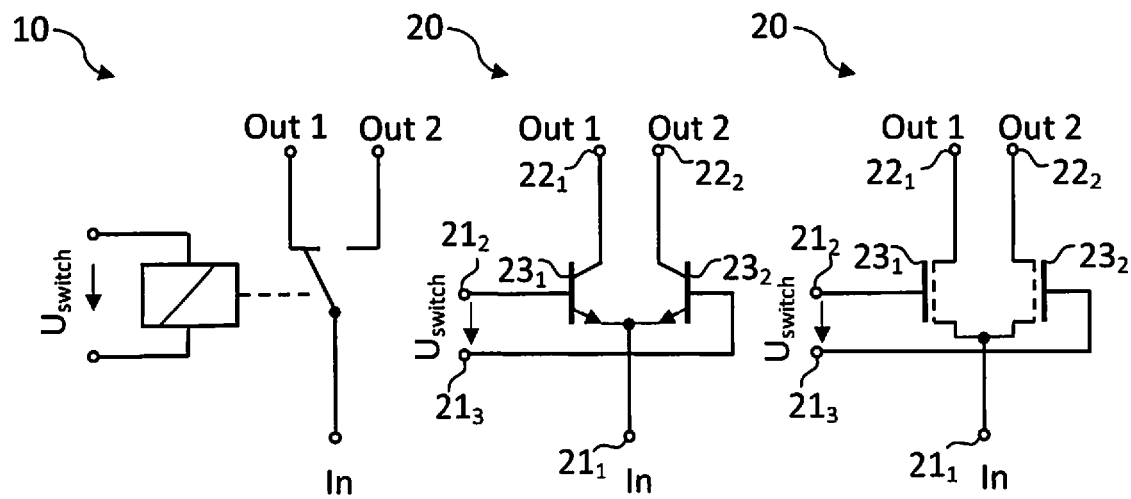
Fig. 2A  Fig. 2B  Fig. 2C

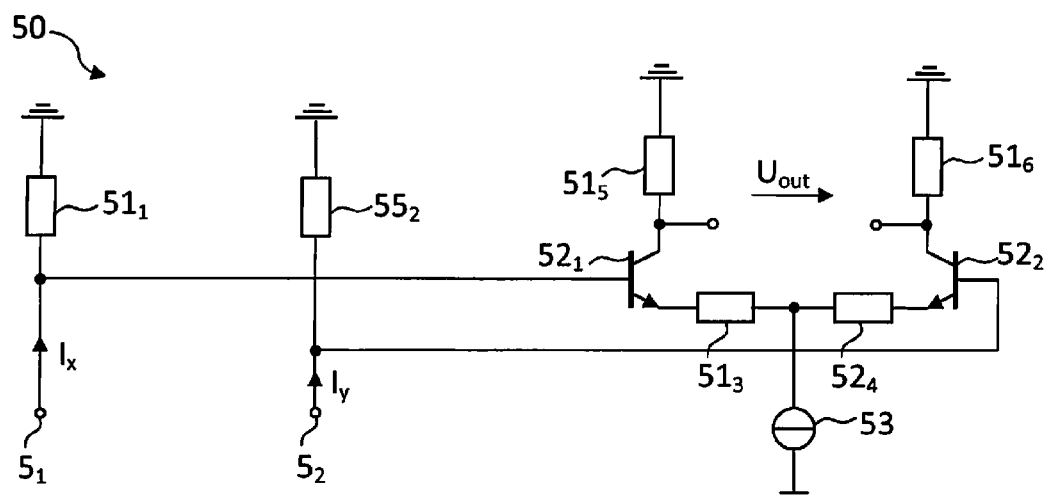
Fig.4A
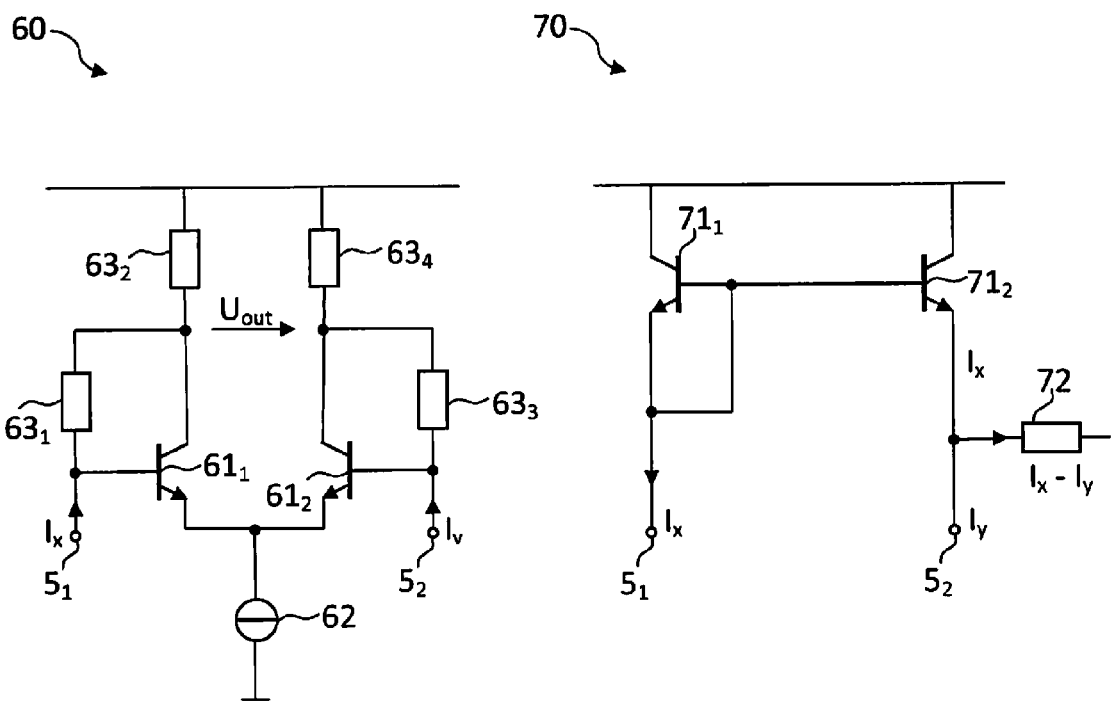
Fig.4B  Fig.4C

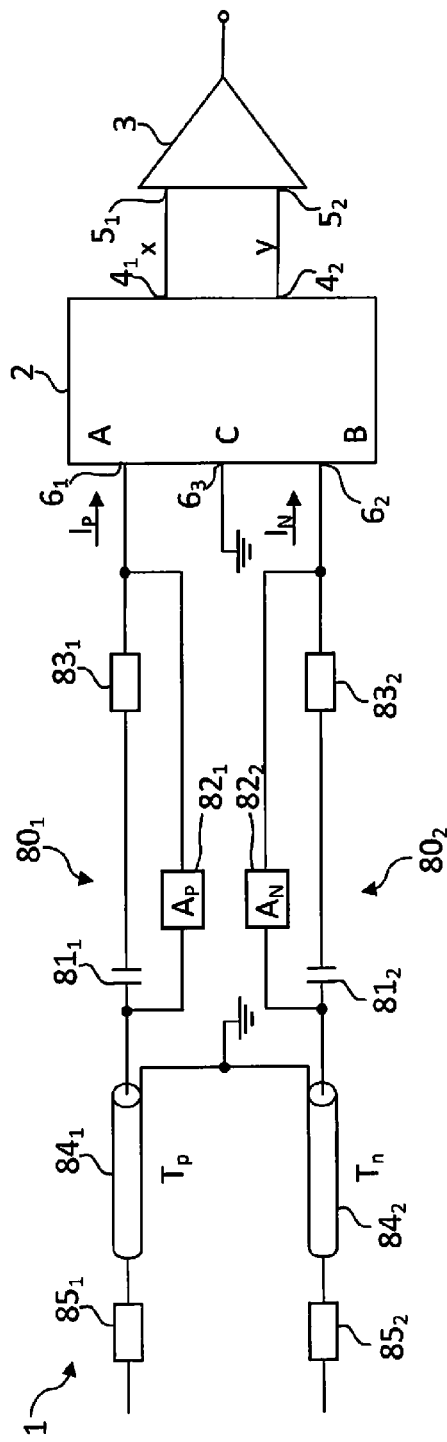
Fig.5A
Fig.5C
Fig.5B

CIRCUIT FOR THE ARITHMETIC LINKING OF SEVERAL INPUT SIGNALS

FIELD OF THE INVENTION

The invention relates to a switching unit for the arithmetic linking of several input signals, as used, for example, in probes of oscilloscopes. This switching unit is generally also referred to as a mode-selection circuit.

BACKGROUND OF THE INVENTION

Modern oscilloscope probes typically have either one or two inputs and can therefore measure either in a ground-referenced or differential manner. A linking of the input signals in this context takes place only in the basic device (oscilloscope) itself. Accordingly, in the measurement of several signals, several probes are also always required or respectively, with the use of a single probe, this must be re-contacted several times.

A mode-selection amplifier circuit for use in a signal registering probe is known from EP 2 022 169 B1. The mode-selection amplifier circuit in this context comprises several difference-amplifier circuits, to which three signal inputs are supplied. For the case that one of the supplied signals is a reference signal (for example, ground), with the mode-selection amplifier circuit presented, either the push-pull-mode, the common-mode or one of the corresponding ground-referenced modes can be measured. The disadvantage with EP 2 022 169 B1 is that the bandwidth is restricted because of the use of difference-amplifiers for the arithmetic combination of the input signals, and that the difference amplifiers necessarily require voltages as input signals, so that the transistors within the difference amplifiers must be designed for the full voltage range of the input signals. As a result, either the input-voltage range must be severely restricted, or it is not possible to use particularly fast transistors with a very high transit frequency, because these transistors provide a low breakdown voltage.

An object of the present invention is therefore to provide a switching unit for the arithmetic linking of several input signals and a corresponding probe which allows the use of very fast transistors in order to achieve a high bandwidth with these.

SUMMARY OF THE INVENTION

The switching unit according to the invention serves for the arithmetic linking of at least two of the input signals supplied to the switching unit, whereas the switching unit provides a switching matrix, to which the at least two input signals are supplied. Accordingly, the switching matrix applies at least one summation operation to at least two input signals and/or it applies at least one multiplication operation to at least one input signal and/or it connects at least one input signal directly through to a first output. In this context, the switching matrix comprises several current switches. It is particularly advantageous that the switching unit performs an arithmetic linking of at least two of the input signals supplied to the switching unit. In the course of this description, arithmetic linking is understood to mean either a summation of currents, a difference formation of currents or a multiplication, especially by constant factors between 0 and 1. In this context, it is particularly advantageous that the switching matrix comprises several current switches. This means that, for the case that the input signals are currents, these can be directly further processed. Furthermore, because of the low-ohmic current input, the voltage range at the input of the current switch is very low. Accordingly, very fast transistors with maximum transit frequencies and low breakdown voltages can be used. Current switches of this kind have a relatively lower noise than difference amplifiers.

Furthermore, it is particularly advantageous if the switching matrix provides a second output, if the switching unit provides exactly one difference-forming element and if the exactly one difference-forming element is connected to the first output and to the second output of the switching matrix. This means that the switching unit can form, on the one hand, a subtraction of two input signals (for example, push-pull-mode A-B) and, on the other hand, can also form the common-mode $(((A+B)/2)-C)$.

Furthermore, it is particularly advantageous if a current switch provides a first input, a second input, a third input, a first output and a second output. Furthermore, it is advantageous if the current switch in this context also provides a first transistor and a second transistor, whereas both transistors are connected at their emitter terminal respectively at their source terminal to one another and to the first input. A base terminal respectively gate terminal of the first transistor is connected in this context to the second input, whereas a base terminal respectively gate terminal of the second transistor is connected to the third input. In this case, a control voltage is applied to the second and to the third input. A collector terminal respectively drain terminal of the first transistor is connected to the first output and a collector terminal respectively drain terminal of the second transistor is connected to the second output. Such a current switch allows the current supplied to the first input to flow either via the first transistor or via the second transistor dependent upon the selected polarity of the control voltage. For the case that the control voltage amounts to 0 V, it is possible with this circuit construction to cause the input current to be subdivided uniformly via both transistors, that is, a multiplication by the factor 0.5 takes place. With the assistance of such a current switch and the precisely one difference-forming element, the switching unit is therefore capable of performing the arithmetic links mentioned in the introduction.

A further advantage is achieved if a first input signal is supplied to the switching matrix at a first input via a first parallel circuit comprising a first capacitor and a first amplifier arrangement and/or if a second input signal is supplied to the switching matrix at a second input via a second parallel circuit comprising a second capacitor and a second amplifier arrangement. In this context, the amplifier arrangements and the capacitors also belong to the switching unit. Such a parallel circuit causes a high-frequency input signal to be supplied via the corresponding capacitor to the corresponding input of the switching matrix, whereas, in another measurement, a low frequency input signal is supplied via the amplifier arrangement to the corresponding input. The amplifier input ensures that the low-frequency input signal provides the same input level as the high-frequency input signal.

Furthermore, it is particularly advantageous if the first amplifier arrangement provides a first amplifier and a first resistive voltage splitter, whereas the first resistive voltage splitter is arranged upstream of the input of the first amplifier and/or if the second amplifier arrangement provides a second amplifier and a second resistive voltage splitter, whereas the second resistive voltage splitter is arranged upstream of the input of the second amplifier. This allows a low-frequency input signal which provides a higher level to be attenuated correspondingly, so that it has approximately the same level at the output of the amplifier arrangement as a high-frequency input signal.

A further advantage is also achieved if a probe according to the invention for an oscilloscope provides a switching unit corresponding to the preceding claims. In this context, it is particularly advantageous if such a switching unit is embodied directly in the probe and the arithmetic links are calculated not, for example, only within the oscilloscope. As a result, the noise can be further reduced.

BRIEF DESCRIPTION OF THE DRAWINGS

Various exemplary embodiments of the invention are described below by way of example with reference to the drawings. Identical subject matters provide the same reference numbers. In detail, the corresponding figures of the drawings show:

FIG. 1 a block diagram of the switching unit according to the invention providing a switching matrix and precisely one difference-forming element;

FIG. 2A a conventional switch which is controlled through a relay;

FIG. 2B a transistor current switch which comprises bipolar transistors;

FIG. 2C a transistor current switch which comprises field-effect transistors;

FIG. 4A an exemplary embodiment of a difference-forming element in the form of a difference amplifier;

FIG. 4B an exemplary embodiment of a difference-forming element in the form of a trans-impedance stage;

FIG. 4C an exemplary embodiment of a difference-forming element in the form of a current-balancing circuit;

FIG. 5A a block diagram of the switching unit according to the invention for a probe of an oscilloscope, providing an input circuitry of the switching matrix;

FIG. 5B a block diagram of a first amplifier arrangement for the input circuitry of the switching matrix; and FIG. 5C a further block diagram of a second amplifier arrangement for the input circuitry of the switching matrix.

DETAILED DESCRIPTION OF EMBODIMENTS

Figure 3A:
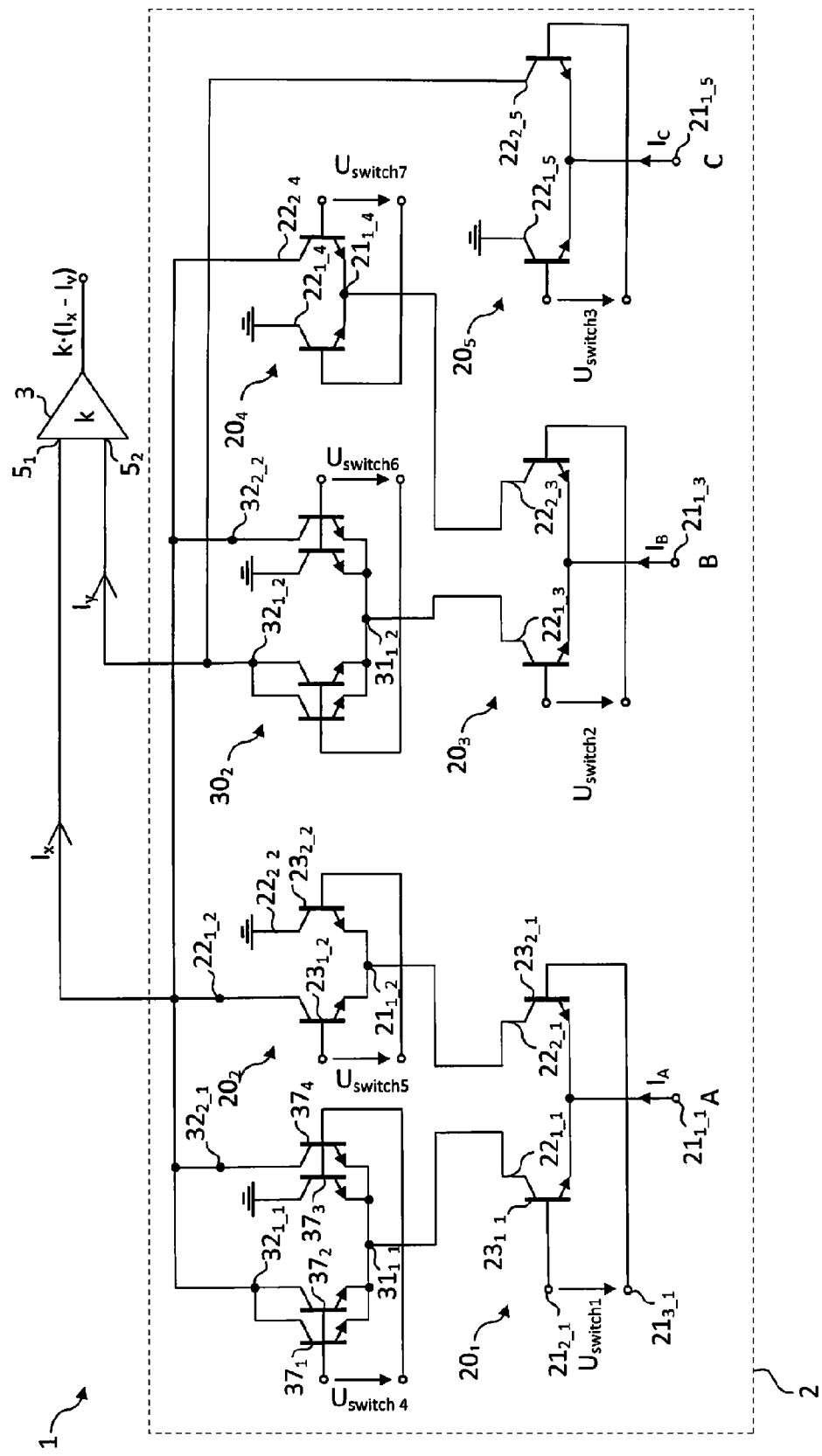
FIG. 3A an exemplary embodiment of the switching unit according to the invention.

FIG. 1 shows a block diagram of the switching unit 1 according to the invention, providing a switching matrix 2 and precisely one difference-forming element 3. The switching unit 1 in this context serves for the arithmetic linking of at least two input signals A, B, C supplied to the switching unit 1. It is clearly evident that the input signals A, B, C are supplied to the switching matrix 2 within the switching unit 1. By preference, all of the input signals A, B, C relate to an input current. In this context, the switching matrix 2 is embodied in order to apply at least one summation operation to at least two input signals A, B, C. The switching matrix 2 can also apply at least one multiplication operation to at least one input signal A, B, C. Otherwise, the switching matrix 2 can also connect at least one input signal A, B, C directly through to a first output $4_1$. It is clearly evident that a first signal x is output at the first output $4_1$. Furthermore, the switching matrix 2 provides a further, second output $4_2$. At the second output $4_2$, a second signal y is output. The signals x and y can be the same or different.

The first output $4_1$ is connected to a first input $5_1$ of the difference-forming element 3. The second output $4_2$ is connected to a second input $5_2$ of the difference-forming element 3. In this context, the switching unit 1 comprises one difference-forming element 3. The precisely one difference-forming element 3 can relate either to precisely one difference amplifier 50 or to a trans-impedance stage 60 or a current-balancing circuit 70.

In this context, a first input signal A is supplied to a first input $6_1$ of the switching matrix 2. A second input signal B is supplied to the switching matrix 2 at its second input $6_2$. The third input signal C is supplied to the switching matrix 2 at its third input $6_3$. The third input signal C is preferably the reference ground. It is clearly evident that the switching matrix 2 can also provide an arbitrary number of further inputs, so that an arbitrary number of further input signals can be supplied to them. The switching matrix 2 therefore preferably comprises transistor current switches 20.

In the following, the functioning of one of the so-called transistor current switches 20 is explained. These function in a similar manner to a switching relay 10, which is shown in FIG. 2A. It is clearly evident, that upon the application of a switching voltage $U_{switch}$, a current flows, which generates a magnetic flux in an excitation coil, which flows through the ferromagnetic core and a similarly ferromagnetic anchor disposed thereon, mounted in a movable manner. At an air gap, a force is applied to the anchor, so that the latter switches one or more contacts. In this context, the anchor is reset to the starting position by a spring force, as soon as the coil is no longer excited. In this case, the input "In" can be connected to one of the two outputs "$Out_1$", "$Out_2$".

FIG. 2B shows a transistor current switch 20 which comprises bipolar transistors. In the following, the transistor current switch 20 is designated by way of simplification as a current switch 20. The current switch 20 provides a first input $21_1$, a second input $21_2$, a third input $21_3$, a first output $22_1$ and a second output $22_2$. The current switch 20 further provides a first transistor $23_1$ and a second transistor $23_2$. Both transistors $23_1$, $23_2$ are connected at their emitter terminal to one another and to the first input $21_1$. Furthermore, a base terminal of the first transistor $23_1$ is connected to the second input $21_2$. A base terminal of the second transistor $23_2$ is further connected to the third input $21_3$. A switching voltage $U_{switch}$ is applied to the second and third input $21_2$, $21_3$.

A collector terminal of the first transistor $23_1$ is connected to the first output $22_1$. Furthermore, a collector terminal of the second transistor $23_2$ is connected to the second output $22_2$. By applying an appropriate switching voltage $U_{switch}$, an input current which is applied at the first input $21_1$, can be connected either to the first output $22_1$ or to the second output $22_2$ of the current switch 20. The current switch 20 can also subdivide an input current respectively an input signal A, B, C between the first output $22_1$ and the second output $22_2$. In the case of the application of a switching voltage of, for example, $U_{switch}=0$ V, an input current, that is, an input signal A, B, C, is subdivided in equal parts between the first output $22_1$ and the second output $22_2$. In this manner, a multiplication operation with a constant factor between 0 and 1 can be realised. Such a multiplication operation can also be achieved by the parallel switching of two current switches 20. This will be explained in greater detail in due course.

FIG. 2C shows a transistor current switch 20 which comprises field-effect transistors. With regard to the functioning of the current switch 20 from FIG. 2C, reference is made to the description for FIG. 2B. It should be noted that, instead of an emitter terminal, reference is made to a source terminal. Instead of a base terminal within the FIG. 2C, reference is made to a gate terminal and instead of a collector terminal reference is made to a drain terminal.

FIG. 3A shows an exemplary embodiment of the switching unit 1 in which the switching matrix 2 and the difference-forming element 3 according to the invention are shown. It is clearly evident that a first input signal A is supplied to a first current switch $20_1$ at its first input $21_{1\_1}$. The first current switch $20_1$ comprises a first transistor $23_{1\_1}$ and a second transistor $23_{2\_1}$. The transistors $23_{1\_1}$, $23_{2\_1}$ are connected to one another corresponding to FIG. 2B. A switching voltage $U_{switch1}$ is supplied to the first current switch $20_1$ via a second input $21_{2\_1}$ and a third input $21_{3\_1}$. For the case that the switching voltage $U_{switch1}$ provides a positive value, the first input signal A, which relates to an input current $I_A$, is guided via the first transistor $23_{1\_1}$. For the case that the switching voltage $U_{switch1}$ is negative, the first input signal A, which relates to an input current $I_A$, is guided via the second transistor $23_{2\_1}$.

A first output $22_{1\_1}$ is connected to a common input $31_{1\_1}$ of a first multiplication circuit $30_1$. A second output $22_{2\_1}$ of the first current switch $20_1$ is connected to the first input $21_{1\_2}$ of a second current switch $20_2$.

The first multiplication circuit $30_1$ is capable of multiplying an input signal, especially an input current, by a constant factor between 0 and 1. The first multiplication circuit $30_1$ in this context comprises two current switches arranged in parallel, whereas the first inputs of both current switches are connected to one another to form a common input $31_{1\_1}$, whereas the second inputs $31_{2\_1}$ of both current switches are also connected to one another and whereas the third inputs $31_{3\_1}$ of both current switches are also connected respectively to one another. A control voltage $U_{switch4}$ is also applied to the second and third inputs $31_{2\_1}$, $31_{3\_1}$. The first outputs of both current circuits are also connected to one another to form a common first output $32_{1\_1}$. This first common output $32_{1\_1}$ of the first multiplication circuit $30_1$ is connected to a first input $5_1$ of the difference-forming element 3. A second output of the first current switch of the first multiplication circuit $30_1$ is connected to the reference ground. A second output of the second current switch of the multiplication circuit $30_1$ forms a second output $32_{2\_1}$. The second output $32_{2\_1}$ of the first multiplication circuit $30_1$ is connected to the first common output $32_{1\_1}$ of the first multiplication circuit $30_1$ and accordingly to the first input $5_1$ of the difference-forming element 3.

In summary, it can be stated that the first multiplication circuit $30_1$ comprises four transistors $37_1$, $37_2$, $37_3$, $37_4$. The emitter terminals of the transistors $37_1$ to $37_4$ are connected to one another and to the first common input $31_{1\_1}$. The base terminals of the transistors $37_1$ and $37_2$ are also connected to one another and to a second input $31_{2\_1}$. The collector terminals of the transistors $37_1$ and $37_2$ are also connected to one another and to the first common output $32_{1\_1}$. The base terminals of the transistors $37_3$ and $37_4$ are connected to one another and to the third input $31_{3\_1}$. The collector terminal of the transistor $37_3$ is connected to the reference ground. The collector terminal of the transistor $37_4$ is connected to the second output $32_{2\_1}$ of the first multiplication circuit $30_1$.

Dependent upon the selected switching voltage $U_{switch4}$, an input current is guided via the transistors $37_1$, $37_2$ and as far as possible unchanged to the first common output $32_{1\_1}$. In the case of the application of a negative switching voltage $U_{switch4}$ in the illustrated example from FIG. 3A, a current supplied to the first common input $31_{1\_1}$ is subdivided uniformly between the transistors $37_3$ and $37_4$. Half of the current is drained via the transistor $37_3$ to the reference ground, whereas the other half is output via the transistor $37_4$ at the second output $32_{2\_1}$ of the first multiplication circuit $30_1$. This current is supplied to the difference-forming element 3 via the first input $5_1$.

The second current switch $20_2$ also comprises a first transistor $23_{1\_2}$ and a second transistor $23_{2\_2}$, whereas both transistors $23_{1\_2}$ and $23_{2\_2}$ are connected at their emitter terminal to one another and to the first input $21_{1\_2}$. The collector terminal of the first transistor $23_{1\_2}$ of the second current switch $20_2$ is also connected to the first input $5_1$ of the difference-forming element 3. The collector terminal of the second transistor $23_{2\_2}$ of the second current switch $20_2$ is connected to the reference ground. In the exemplary embodiment, in the case of the application of a positive switching voltage $U_{switch5}$, the input current supplied to the first input $21_{1\_2}$ is routed via the first transistor $23_{1\_2}$ of the second current switch $20_2$ to the first input $5_1$ of the difference-forming element 3. In the case of a negative switching voltage $U_{switch5}$, an input current supplied to the first input $21_{1\_2}$ is drained to the reference ground via the second transistor $23_{2\_2}$ of the second current switch $20_2$.

A second input signal B, which preferably relates to an input current $I_B$, is supplied to a third current switch $20_3$ at its first input $21_{1\_3}$. Dependent upon the switching voltage $U_{switch2}$, the input current $I_B$ is output at a first output $22_{1\_3}$ or at a second output $22_{2\_3}$. The first output $22_{1\_3}$ of the third current switch $20_3$ is connected to a common input $31_{1\_2}$ of a second multiplication circuit $30_2$. The second multiplication circuit $30_2$ is constructed in exactly the same manner as the first multiplication circuit $30_1$. However, it is evident that, for reasons relating to the drawings, the corresponding switching voltage $U_{switch6}$, of the second multiplication circuit $30_2$ is illustrated on the right-hand side, so that a multiplication by a constant factor between 0 and 1 takes place with the second multiplication circuit $30_2$ in the case of a positive switching voltage $U_{switch6}$. The second multiplication circuit $30_2$ also provides a first common output $32_{1\_2}$, which is connected to the second input $5_2$ of the difference-forming element 3. On the other side, the second multiplication circuit $30_2$ provides a second output $32_{2\_2}$ which is connected to the first input $5_1$ of the difference-forming element 3.

The second output $22_{2\_3}$ of the third current switch $20_3$ is connected to a first input $21_{1\_4}$ of a fourth current switch $20_4$. A first output $22_{1\_4}$ of the fourth current switch $20_4$ is connected to the reference ground. A second output $22_{2\_4}$ of the fourth current switch $20_4$ is connected to the first input $5_1$ of the difference-forming element 3. A switching voltage $U_{switch7}$ allows an input current supplied to the first input $21_{1\_4}$ to be switched to and fro between the two outputs $22_{1\_4}$, $22_{2\_4}$. It should be noted, that for reasons relating to the drawing, $U_{switch7}$ of the fourth current switch $20_4$ is opposite to the switching voltage $U_{switch2}$ of the third current switch $20_3$.

Furthermore, the switching unit 1 also provides a fifth current switch $20_5$. The fifth current switch $20_5$ also has a first input $21_{1\_5}$ to which the first input signal C, which relates especially to the input current $I_C$, is supplied. A first output $22_{1\_5}$ of the fifth current switch $20_5$ is connected to the reference ground. A second output $22_{2\_5}$ of the fifth current switch $20_5$ is connected to the second input $5_2$ of the difference-forming element 3.

The following Table 1 explains, by way of example, how the switching voltages $U_{switch1}$ to $U_{switch7}$ can be selected in order to implement the desired measurements. The desired measurements, that is, the arithmetic links, are A-B, A-C, B-C or (A+B)/2–C, respectively $I_A$-$I_B$, $I_A$-$I_C$, $I_B$-$I_C$, or $(I_A$+$I_B)/2$-$I_C$. For the case that the switching unit 1 is to form the arithmetic link A-B, the switching matrix 2 must supply the input signal A to the first input $5_1$ of the difference-forming element 3 and the input signal B to the second input $5_2$. In this context, the switching voltages $U_{switch1}$ to $U_{switch7}$ should be selected in such a manner that the input signal A which relates to the input current $I_A$, is output at the first output $22_{1\_1}$ of the first current switch $20_1$. Accordingly, the input signal A is supplied to the first multiplication circuit $30_1$. In this context, the switching voltage $U_{switch4}$ is selected in such a manner that the input signal A is output via the transistors $37_1$, $37_2$ at the first common output $32_{1\_1}$ and is accordingly present at the first input $5_1$ of the difference-forming element 3.

On the other side, the input signal B, that is the input current $I_B$, is supplied to the first input $21_{1\_2}$ of the third current switch $20_3$. The switching voltage $U_{switch2}$ in this context is selected in such a manner that the input signal B is output at the first output $22_{1\_3}$ of the third current switch $20_3$. Following this, the input signal is supplied to the second multiplication circuit $30_2$. The switching voltage $U_{switch6}$ in this context is selected to be negative, so that the input signal B is output at the first common output $32_{1\_2}$ of the second multiplication circuit $30_2$. As a result, the second input signal B is present at the second input $5_2$ of the difference-forming element 3.

So that the measurement is not disturbed, the third input signal C, which relates to the input current $I_C$ should be correspondingly drained. In this context, the third input signal C is present at the first input $21_{1\_5}$ of the fifth current switch $20_5$. The switching voltage $U_{switch3}$ in this context is selected in such a manner that the third input signal C is output at the first output $22_{1\_5}$ and drained there to the reference ground. As a result, the insulating capability of the switching matrix 2 is increased.

The illustrated voltages of +0.4 V and −0.4 V are indicated only by way of example. Other voltages can also be set. For the case that the arithmetic link A-C respectively B-C is to be set, the switching matrix 2 must connect the first input signal A to the first input $5_1$ and the third input signal C to the second input $5_2$, respectively the second input signal B to the first input $5_1$ and the third input signal C to the second input $5_2$.

For the case that a common-mode measurement is to take place, the arithmetic link must amount to (A+B)/2−C. This means that the input signals A and B, which relate to the input currents $I_A$ and $I_B$, must each be halved in their magnitude. This occurs in that the input current $I_A$ is output via the second output $32_{2\_1}$ of the first multiplication circuit $30_1$, and the input current $I_B$ is output via the second output $32_{2\_2}$ of the second multiplication circuit $30_2$. Both currents are therefore added at the first input $5_1$ of the difference-forming element 3. In this case, the third input current $I_C$ is supplied to the second input $5_2$ of the difference-forming element 3. The corresponding switching voltages are specified in Table 1.

It should be noted that the circuit construction from FIG. 3A is only of an exemplary nature. For example, the second current switch $20_2$ can also be omitted. In this case, the second output $22_{2\_1}$ of the first current switch $20_1$ must be connected directly to the reference ground.

Figure 3B:
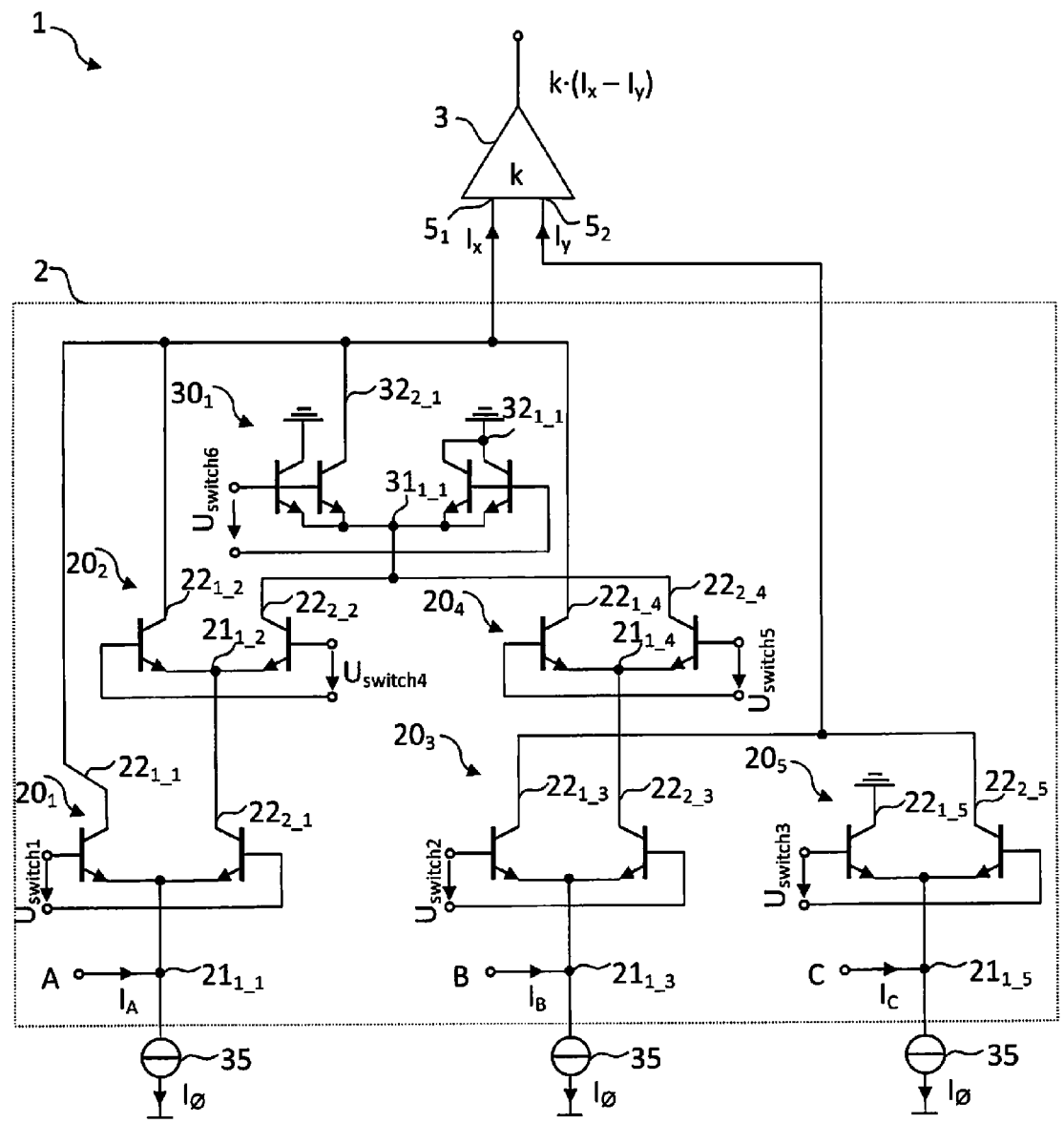
FIG. 3B a further exemplary embodiment of the switching unit according to the invention.

FIG. 3B shows a further exemplary embodiment of the switching unit 1 according to the invention which contains the switching matrix 2 and the difference-forming element 3. A first input signal A is supplied to a first current switch $20_1$ at its first input $21_{1\_1}$. A first output $22_{1\_1}$ of the first current switch $20_1$ is connected to a first input $5_1$ of the difference-forming element 3. A second output $22_{2\_1}$ of the first current switch $20_1$ is connected to a first input $21_{1\_2}$ of a second current switch $20_2$. A first output $22_{1\_2}$ of the second current switch $20_2$ is connected to the first input $5_1$ of the difference-forming element 3. A second output $22_{2\_2}$ of the second current switch $20_2$ is connected to a common input $31_{1\_1}$ of a first multiplication circuit $30_1$. A common first output $32_{1\_1}$ of the first multiplication circuit $30_1$ is connected to the reference ground. A second output $32_{2\_1}$ of the first multiplication circuit $30_1$ is connected to the first input $5_1$ of the difference-forming element 3.

A second input signal B is supplied to a third current switch $20_3$ at its first input $21_{1\_3}$. A first output $22_{1\_3}$ of the third current switch $20_3$ is connected to the second input $5_2$ of the difference-forming element 3. A second output $22_{2\_3}$ of the third current switch $20_3$ is connected to a first input $21_{1\_4}$ of a fourth current switch $20_4$. A first output $22_{1\_4}$ of the fourth current switch $20_4$ is connected to the first input $5_1$ of the difference-forming element 3. A second output $22_{2\_4}$ of the fourth current switch $20_4$ is connected to the common input $31_{1\_1}$ of the first multiplication circuit $30_1$.

A third input signal C, in the form of an input current $I_C$ is supplied to a fifth current switch $20_5$ at a first input $21_{1\_5}$. A first output $22_{1\_5}$ of the fifth current switch $20_5$ is connected to the reference ground. A second output $22_{2\_5}$ of the fifth current switch $20_5$ is connected to the second input $5_2$ of the difference-forming element 3.

Furthermore, it is clearly evident that a further current $I_\Theta$ from the current source 35 is superposed on the input signal A, which is present in the form of a current $I_A$. The current $I_\Theta$ is a constant current. This ensures that the input signal supplied to the first current switch $20_1$ always provides a positive value, so that a current can always flow via the first current switch $20_1$. This applies in particular for the transistors which make up the first current switch $20_1$. The same also applies for the second input signal B and the third input signal C, which are also superposed with a constant current $I_\Theta$. This current also comes from the current source 35. In this context, a common current source or several separate current sources can be used.

Table 2 shows the various switching voltages $U_{switch1}$ to $U_{switch6}$ to be applied in order to adjust the various arithmetic links. To adjust the arithmetic links A-C within the switching matrix, the switching voltage $U_{switch1}$ of the first current switch $20_1$ is selected in such a manner that the input signal A is output at the second output $22_{2\_1}$ of the first current switch. The switching voltage $U_{switch4}$ of the second current switch

TABLE 1

| Mode | $U_{switch1}$ | $U_{switch2}$ | $U_{switch3}$ | $U_{switch4}$ | $U_{switch5}$ | $U_{switch6}$ | $U_{switch7}$ | $I_X$ | $I_Y$ | $I_X - I_Y$ |
|---|---|---|---|---|---|---|---|---|---|---|
| Push-pull | +0.4 V | +0.4 V | +0.4 V | +0.4 V | −0.4 V | −0.4 V | −0.4 V | $I_A$ | $I_B$ | $I_A - I_B$ |
| Common-mode | +0.4 V | +0.4 V | −0.4 V | −0.4 V | −0.4 V | +0.4 V | −0.4 V | $(I_A + I_B)/2$ | $I_C$ | $(I_A + I_B)/2 - I_C$ |
| Ground ref. A | −0.4 V | −0.4 V | −0.4 V | −0.4 V | +0.4 V | +0.4 V | −0.4 V | $I_A$ | $I_C$ | $I_A - I_C$ |
| Ground ref. B | −0.4 V | −0.4 V | −0.4 V | −0.4 V | −0.4 V | +0.4 V | +0.4 V | $I_B$ | $I_C$ | $I_B - I_C$ |

$20_2$ is selected in such a manner that the input signal A, which is supplied to the second current switch $20_2$ via the first input $21_{1\_2}$ is output via the first output $22_{1\_2}$. In this case, the input signal A is present via the first and second current switch $20_1$, $20_2$ at the first input $5_1$ of the difference-forming element 3. The switching voltage $U_{switch3}$ of the fifth current switch $20_5$ is selected in such a manner that the input signal C is output at the second output $22_{2\_5}$ of the fifth current switch $20_5$. The input signal C is therefore disposed at the second input $5_2$ of the difference-forming element 3.

It is clearly evident that the first current switch $20_1$ could also apply the first input signal A directly to the first input $5_1$ of the difference-forming element 3. Within the switching matrix 2 according to the invention, however, attention is preferably given to the fact that possible symmetries are retained. For example, for the formation of the arithmetic links B-C, the input signal B is necessarily guided via two current switches $20_3$, $20_4$, until this is also present at the first input $5_1$ of the difference-forming element 3. In the calculation of the arithmetic link A-C by comparison with the arithmetic link B-C, in order to avoid having to calibrate out different attenuations within the switching matrix 2, the input signals A and B are preferably connected through via an equal number of current switches to the first input $5_1$ of the difference-forming element 3.

Because of the fact that, at the first input $5_1$ of the difference-forming element 3, three current switches $20_1$, $20_2$, $20_4$ and a multiplication circuit $30_1$ are connected, an increased capacitance is obtained, which has an unfavourable influence on the attainable bandwidth. Accordingly, upstream of the inputs $5_1$ and $5_2$ of the difference-forming element 3, a further buffer stage can be connected. Such a buffer stage, which is not illustrated, comprises two transistors, which are connected at their base terminal respectively to one another and to a constant voltage source. In this context, the collector terminal of a first transistor is connected to the first input $5_1$ of the difference-forming element 3. The collector terminal of the second transistor of the buffer stage is connected in this context to the second input $5_2$ of the difference-forming element 3. An emitter terminal of the first transistor of the buffer stage, which is not illustrated, is connected to the outputs of the current switches $20_1$, $20_2$, $20_4$ and to the second output $32_{2\_1}$ of the multiplication circuit $30_1$. An emitter terminal of the second transistor of the buffer stage, which is not illustrated, is connected to the first output $22_{1\_3}$ of the third current switch $20_3$ and to the second output $22_{2\_5}$ of the fifth current switch $20_5$.

The difference-forming element 3 therefore sees at its first input $5_1$ only the capacitance of the first transistor of the buffer stage which is not illustrated. This capacitance amounts to only one quarter of the capacitance which the difference-forming element 3 would otherwise see. Consequently, a 4-times higher bandwidth can be achieved.

Figure 3C:
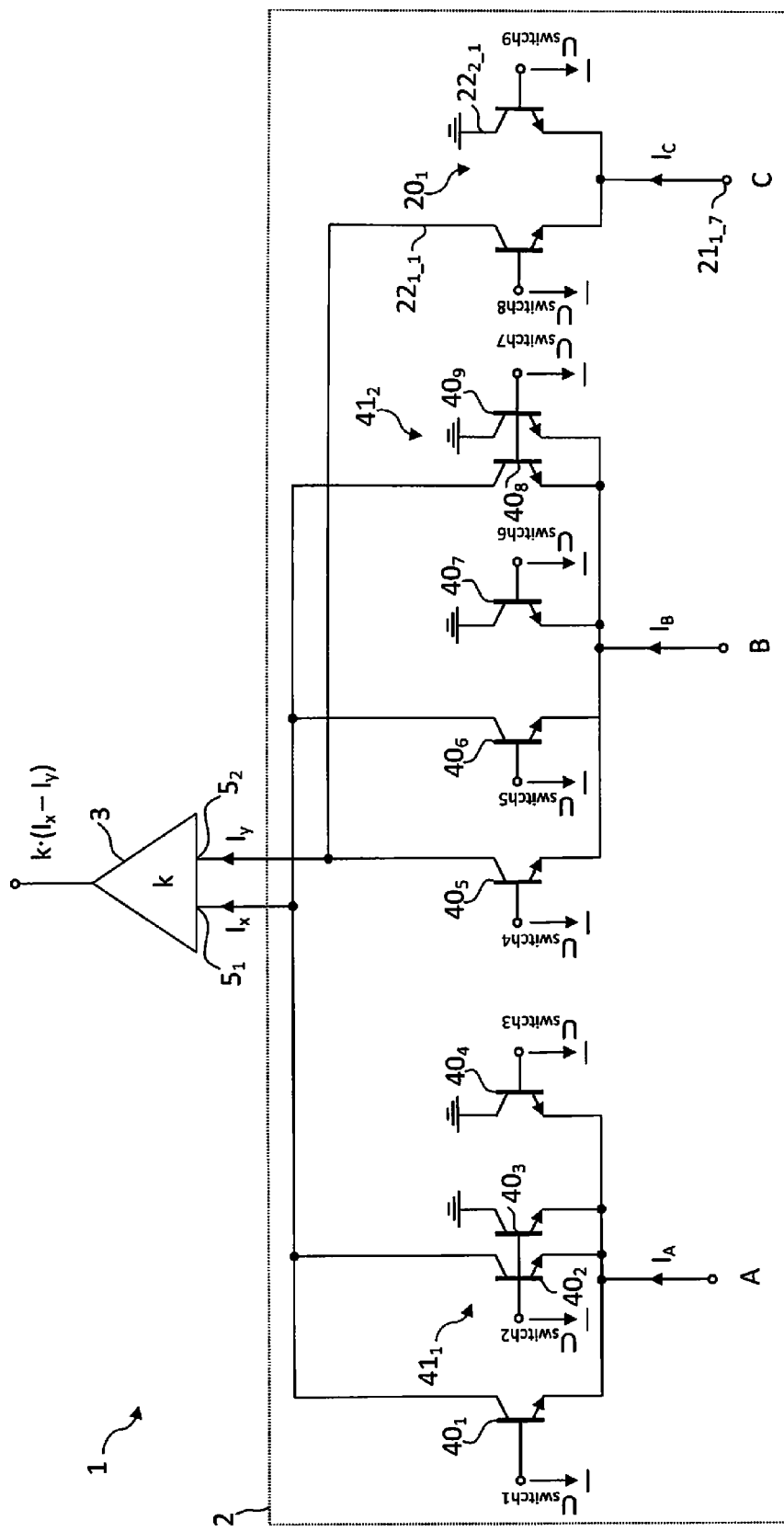
FIG. 3C an additional exemplary embodiment of the switching unit according to the invention.

FIG. 3C shows an additional exemplary embodiment of the switching unit 1 according to the invention which provides a switching matrix 2 and a difference-forming element 3. It is clearly evident that a third input signal C in the form of an input current $I_C$ is supplied to a first current switch $20_1$ at its first input $21_{1\_1}$. A first output $22_{1\_1}$ of the first current switch $20_1$ is connected to the second input $5_2$ of the difference-forming element 3. Furthermore, a second output $22_{2\_2}$ of the first current switch $20_1$ is connected to the reference ground.

Furthermore, the first input signal A is connected via a third transistor $40_1$ to the first input $5_1$ of the difference-forming element 3. The first input signal A is further connected via a first multiplication circuit $41_1$ to the first input $5_1$ of the difference-forming element 3. This first multiplication circuit $41_1$ comprises two transistors $40_2$ and $40_3$. The base terminals of the two transistors $40_2$, $40_3$ are connected to one another. The emitter terminal of the two transistors $40_2$ and $40_3$ are also connected to one another. The first input signal A is supplied via these. The collector terminal of the transistor $40_2$ is connected to the first input $5_1$ of the difference-forming element 3. The collector terminal of the transistor $40_3$ is connected to the reference ground. For the case that a positive switching voltage $U_{switch2}$ is applied to the base terminal of the two transistors $40_2$, $40_3$, an input signal A in the form of the input current $I_A$ is subdivided into two equally large currents. Furthermore, the input signal A is also supplied to a fourth transistor $40_4$ at its emitter terminal, whereas the collector terminal of the fourth transistor $40_4$ is connected to the reference ground.

Furthermore, the second input signal B is connected via a fifth transistor $40_5$ to the second input $5_2$ of the difference-forming element 3. In this context, the second input signal B is supplied to the emitter terminal of the fifth transistor $40_5$. The collector terminal of the fifth transistor $40_5$ is connected in this context to the second input $5_2$ of the difference-forming element 3. The second input signal B is further connected via a sixth transistor $40_6$ to the first input $5_1$ of the difference-forming element 3. In this context, the second input signal B is also supplied to the emitter terminal of the sixth transistor $40_6$, whereas the collector terminal of the sixth transistor $40_6$ is connected to the first input $5_1$ of the difference-forming element 3. The second input signal B is further connected via a seventh transistor $40_7$ to the reference ground. In this context, the second input signal B is supplied to the emitter terminal of the seventh transistor $40_7$, whereas the collector terminal of the seventh transistor $40_7$ is connected to the reference ground.

The second input signal B is further connected via a second multiplication circuit $41_2$ to the first input $5_1$ of the difference-forming element 3. The second multiplication circuit $41_2$ comprises two transistors $40_8$, $40_9$, of which the base terminals are connected to one another. The emitter terminals of the transistors $40_8$, $40_9$ are also connected to one another. The

TABLE 2

| Mode | $U_{switch1}$ | $U_{switch2}$ | $U_{switch3}$ | $U_{switch4}$ | $U_{switch5}$ | $U_{switch6}$ | $I_X$ | $I_Y$ | $I_X - I_Y$ |
|---|---|---|---|---|---|---|---|---|---|
| Push-pull | +0.4 V | +0.4 V | +0.4 V | +0.4 V | +0.4 V | −0.4 V | $I_A$ | $I_B$ | $I_A - I_B$ |
| Common-mode | −0.4 V | −0.4 V | −0.4 V | +0.4 V | +0.4 V | +0.4 V | $(I_A + I_B)/2$ | $I_C$ | $(I_A + I_B)/2 - I_C$ |
| Ground ref. A | −0.4 V | −0.4 V | −0.4 V | −0.4 V | +0.4 V | −0.4 V | $I_A$ | $I_C$ | $I_A - I_C$ |
| Ground ref. B | −0.4 V | −0.4 V | −0.4 V | +0.4 V | −0.4 V | −0.4 V | $I_B$ | $I_C$ | $I_B - I_C$ | second input signal B is supplied via the emitter terminals. The collector terminal of the transistor $40_8$ is connected to the first input $5_1$ of the difference-forming element 3. The collector terminal of the transistor $40_9$ is connected to the reference ground. As also in the case of the first multiplication circuit $41_1$, the second multiplication circuit $41_2$ can also perform a multiplication with a constant factor between 0 and 0.5 dependent upon the selection of the switching voltage $U_{switch7}$.

The difference-forming element 3 forms a difference between the input signals which are supplied to it at the first input $5_1$ and the second input $5_2$. The difference-forming element 3 can optionally also amplify this difference by a factor k. In this context, the factor k can also be selected smaller than 1, so that the difference-forming element also provides an attenuating effect. The factor k can also amount to precisely 1, so that no amplification and no attenuation is adjusted. The factor k can also be a trans-impedance, so that a current-voltage conversion is performed.

The following Table 3 specifies for the adjustable arithmetic links A-B, A-C, B-C, (A+B)/2−C the necessary switching voltages $U_{switch1}$ to $U_{switch9}$.

context, the second input signal B is supplied to an emitter terminal of the fourth transistor $40_4$, whereas collector terminal of the fourth transistor $40_4$ is connected to the first input $21_{1\_1}$ of the first current switch $20_1$.

Furthermore, the second input signal B is supplied to an emitter terminal of a fifth transistor $40_5$, whereas a collector terminal of the fifth transistor $40_5$ is connected to the reference ground.

The second input signal B is further supplied via a sixth transistor $40_6$ to the second current switch $20_2$ at its first input $21_{1\_2}$. In this context, the second input signal B is supplied to an emitter terminal of the sixth transistor $40_6$, whereas a collector terminal of the sixth transistor $40_6$ is connected to the first input $21_{1\_2}$ of the second current switch $20_2$.

A third input signal C, which preferably relates to the reference ground, is supplied via a seventh transistor $40_7$ to the first current switch $20_1$ at its first input $21_{1\_1}$. In this context, the third input signal C is supplied to an emitter terminal of the seventh transistor $40_7$, whereas a collector terminal of the seventh transistor $40_7$ is connected to the first input $21_{1\_1}$ of the first current switch $20_1$.

TABLE 3

| Mode | $U_{switch1}$ | $U_{switch2}$ | $U_{switch3}$ | $U_{switch4}$ | $U_{switch5}$ | $I_X$ | $I_Y$ | $I_X - I_Y$ |
|---|---|---|---|---|---|---|---|---|
| Push-pull | +0.4 V | −0.4 V | −0.4 V | +0.4 V | −0.4 V | $I_A$ | $I_B$ | $I_A - I_B$ |
| Common-mode | −0.4 V | +0.4 V | −0.4 V | −0.4 V | −0.4 V | $(I_A + I_B)/2$ | $I_C$ | $(I_A + I_B)/2 - I_C$ |
| Ground ref. A | +0.4 V | −0.4 V | −0.4 V | −0.4 V | −0.4 V | $I_A$ | $I_C$ | $I_A - I_C$ |
| Ground ref. B | −0.4 V | −0.4 V | +0.4 V | −0.4 V | +0.4 V | $I_B$ | $I_C$ | $I_B - I_C$ |

| Mode | $U_{switch6}$ | $U_{switch7}$ | $U_{switch8}$ | $U_{switch9}$ | $I_X$ | $I_Y$ | $I_X - I_Y$ |
|---|---|---|---|---|---|---|---|
| Push-pull | −0.4 V | −0.4 V | −0.4 V | +0.4 V | $I_A$ | $I_B$ | $I_A - I_B$ |
| Common-mode | −0.4 V | +0.4 V | +0.4 V | −0.4 V | $(I_A + I_B)/2$ | $I_C$ | $(I_A + I_B)/2 - I_C$ |
| Ground ref. A | +0.4 V | −0.4 V | +0.4 V | −0.4 V | $I_A$ | $I_C$ | $I_A - I_C$ |
| Ground ref. B | −0.4 V | −0.4 V | +0.4 V | −0.4 V | $I_B$ | $I_C$ | $I_B - I_C$ |

Figure 3D:
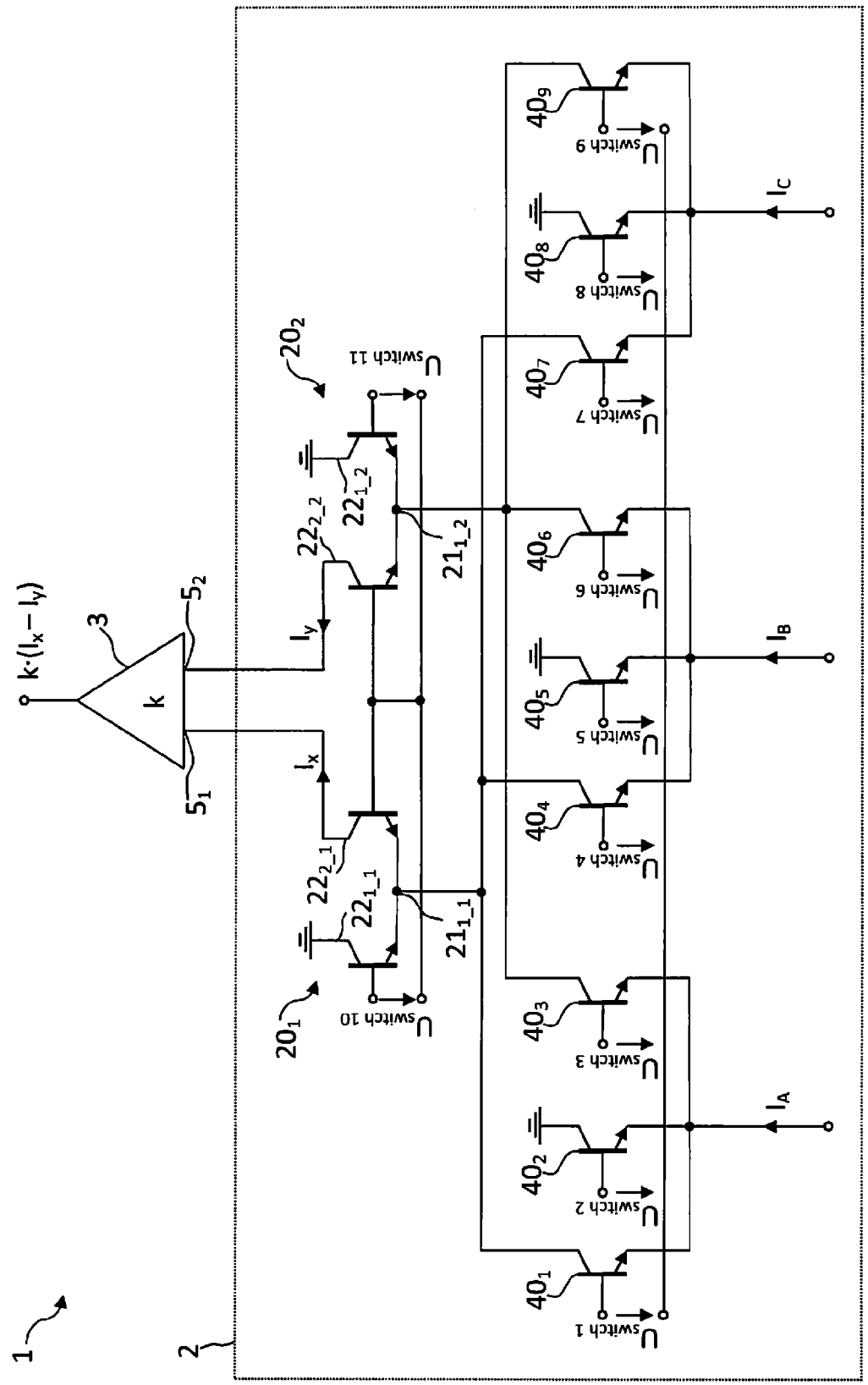
FIG. 3D an additional exemplary embodiment of the switching unit according to the invention.

FIG. 3D shows an additional exemplary embodiment of the switching unit 1 according to the invention which provides a switching matrix 2 and a difference-forming element 3. A first input signal A is supplied via a first transistor $40_1$ to a first current switch $20_1$ at its first input $21_{1\_1}$. In this context, the first input signal A is supplied to an emitter terminal of the first transistor $40_1$, whereas a collector terminal of the first transistor $40_1$ is connected to the first input $21_{1\_1}$ of the first current switch $20_1$.

Furthermore, the first input signal A is supplied to an emitter terminal of a second transistor $40_2$, whereas a collector terminal of the second transistor $40_2$ is connected to the reference ground.

The first input signal A is further supplied via a first transistor $40_3$ to a second current switch $20_2$ at its first input $21_{1\_2}$. In this context, the first input signal A is supplied to an emitter terminal of the third transistor $40_3$, whereas a collector terminal of the third transistor $40_3$ is connected to the first input $21_{1\_2}$ of the second current switch $20_2$.

A second input signal B is supplied via a fourth transistor $40_4$ to the first current switch $20_1$ at its first input $21_{1\_1}$. In this Furthermore, the third input signal C is supplied to an emitter terminal of an eighth transistor $40_8$, whereas a collector terminal of the eighth transistor $40_8$ is connected to the reference ground.

The third input signal C is further supplied via a ninth transistor $40_9$ to the second current switch $20_2$ at its first input $21_{1\_2}$. In this context, the third input signal C is supplied to an emitter terminal of the ninth transistor $40_9$, whereas a collector terminal of the ninth transistor $40_9$ is connected to the first input $21_{1\_2}$ of the second current switch $20_2$.

A first output $22_{1\_1}$ of the first current switch $20_1$ is connected in this context to the reference ground. A second output $22_{2\_1}$ of the first current switch $20_1$ is connected to a first input $5_1$ of the difference-forming element 3. A first output $22_{1\_2}$ of the second current switch $20_2$ is connected in this context to the reference ground. A second output $22_{2\_2}$ of the second current switch $20_2$ is connected to a second input $5_2$ of the difference-forming element 3. The base terminals of the transistors within the first and second current switch $20_1$, $20_2$, of which the collectors are connected to the first or second input $5_1$, $5_2$ of the difference-forming element 3, are also connected to one another.

The switching voltages $U_{switch\ 1}$ to $U_{switch\ 9}$ are applied corresponding to Table 4 to the transistors $40_1$ to $40_9$ for the control. The switching voltage $U_{switch\ 10}$ is applied to the first current switch $20_1$ and the switching voltage $U_{switch\ 11}$ to the second current switch $20_2$.

The exemplary embodiment shown in FIG. 3D is characterised by a particularly high symmetry, and by a minimised output capacitance of the switching matrix 2.

The following Table 4 specifies for the adjustable arithmetic links A-B, A-C, B-C, (A+B)/2-C the necessary switching voltages $U_{switch1}$ to $U_{switch11}$. The voltages 0.4 V and –0.4 V are selected as examples.

TABLE 4

| Mode | $U_{switch1}$ | $U_{switch2}$ | $U_{switch3}$ | $U_{switch4}$ | $I_X$ | $I_Y$ | $I_X - I_Y$ |
|---|---|---|---|---|---|---|---|
| Push-pull | +0.4 V | −0.4 V | −0.4 V | −0.4 V | $I_A$ | $I_B$ | $I_A - I_B$ |
| Common-mode | +0.4 V | −0.4 V | −0.4 V | +0.4 V | $(I_A+I_B)/2$ | $I_C$ | $(I_A+I_B)/2 - I_C$ |
| Ground ref. A | +0.4 V | −0.4 V | −0.4 V | −0.4 V | $I_A$ | $I_C$ | $I_A - I_C$ |
| Ground ref. B | −0.4 V | +0.4 V | −0.4 V | +0.4 V | $I_B$ | $I_C$ | $I_B - I_C$ |

| Mode | $U_{switch5}$ | $U_{switch6}$ | $U_{switch7}$ | $U_{switch8}$ | $I_X$ | $I_Y$ | $I_X - I_Y$ |
|---|---|---|---|---|---|---|---|
| Push-pull | −0.4 V | +0.4 V | −0.4 V | +0.4 V | $I_A$ | $I_B$ | $I_A - I_B$ |
| Common-mode | −0.4 V | +0.4 V | −0.4 V | −0.4 V | $(I_A+I_B)/2$ | $I_C$ | $(I_A+I_B)/2 - I_C$ |
| Ground ref. A | +0.4 V | −0.4 V | −0.4 V | −0.4 V | $I_A$ | $I_C$ | $I_A - I_C$ |
| Ground ref. B | −0.4 V | −0.4 V | −0.4 V | −0.4 V | $I_B$ | $I_C$ | $I_B - I_C$ |

| Mode | $U_{switch9}$ | $U_{switch10}$ | $U_{switch11}$ | $I_X$ | $I_Y$ | $I_X - I_Y$ |
|---|---|---|---|---|---|---|
| Push-pull | −0.4 V | −0.4 V | −0.4 V | $I_A$ | $I_B$ | $I_A - I_B$ |
| Common-mode | +0.4 V | 0 V | −0.4 V | $(I_A+I_B)/2$ | $I_C$ | $(I_A+I_B)/2 - I_C$ |
| Ground ref. A | +0.4 V | −0.4 V | −0.4 V | $I_A$ | $I_C$ | $I_A - I_C$ |
| Ground ref. B | +0.4 V | −0.4 V | −0.4 V | $I_B$ | $I_C$ | $I_B - I_C$ |

FIG. 4A shows an exemplary embodiment of the difference-forming element 3 in the form of a difference amplifier 50. The difference amplifier 50 has a first input $5_1$ and a second input $5_2$. These two inputs are connected to the two outputs $4_1$, $4_2$ of the switching matrix 2. Input currents which are converted into an input voltage in each case through a resistor $51_1$, $51_2$ are preferably supplied to the input $5_1$, $5_2$. For this purpose, a resistor $51_1$ is connected to the reference ground. On the other hand, a further resistor $51_2$ is also connected to the reference ground. The voltage drop across the resistor $51_1$ is supplied to a base terminal of the transistor $52_1$. The voltage drop across the resistor $51_2$ is supplied to a base terminal of the transistor $52_2$. The emitter terminals of the transistors $52_1$, $52_2$ are connected to one another via the resistors $51_3$, $51_4$. Between both resistors $51_3$, $51_4$, a current is supplied via a current source $5_3$. At the collector terminal of the transistor $52_1$, a resistor $51_5$ is connected to the reference ground. At the collector terminal of the transistor $52_2$, a resistor $51_6$ is also connected to the reference ground. Through the selection of the resistors $51_3$, $51_5$ respectively $51_4$, $51_6$, the gain ratio of the difference amplifier 50 can be adjusted.

FIG. 4B shows an exemplary embodiment of a difference-forming element 3 in the form of a trans-impedance stage 60. The trans-impedance stage 60 provides a first input $5_1$ and a second input $5_2$, which are connected to the first output $4_1$ and the second output $4_2$ of the switching matrix 2. The first input $5_1$ is connected to the base terminal of a transistor $61_1$. The emitter terminal of the transistor $61_1$ is connected to a constant current source 62. The collector terminal of the transistor $61_1$ is fed back via a resistor $63_1$ to the base terminal of the transistor $61_1$. The collector terminal of the transistor $61_1$ is further connected via a resistor $63_2$ to the reference ground.

The input $5_2$ is connected to the base terminal of the transistor $61_2$. The emitter terminal of the transistor $61_2$ is connected to the emitter terminal of the transistor $61_1$ and therefore to the constant current source 62. The collector terminal of the transistor $61_2$ is fed back via the resistor $63_3$ with the base terminal of the transistor $61_2$. The collector terminal of the transistor $61_2$ is also connected via the resistor $63_4$ to the reference ground. For the case that the input current at the input $5_1$ increases, the current which flows through the transistor $61_1$ also increases. In this context, the voltage at the collector terminal of the transistor $61_1$ drops. In this context, the voltage at the input also declines through the feedback with the resistor $63_1$.

FIG. 4C shows an exemplary embodiment of a difference-forming element 3 in the form of a current-balancing circuit 70. The current-balancing circuit 70 provides a first input $5_1$ and a second input $5_2$. The first input $5_1$ is connected to the first output $4_1$ of the switching matrix 2. The second input $5_2$ is connected to the second output $4_2$ of the switching matrix 2. The first input $5_1$ is connected to an emitter terminal and a base terminal of a transistor $71_1$. The second input $5_2$ is connected to the emitter terminal of a transistor $71_2$. The base terminals of the transistors $71_1$ and $71_2$ are also connected to one another. A collector terminal of the transistor $71_1$ is also connected, as is a collector terminal of the transistor $71_2$, to the reference ground. The difference between the currents supplied to the inputs $5_1$, $5_2$ can be picked up through the current-balancing circuit 70 at the emitter terminal of the transistors $71_2$. This difference current can be converted into a voltage via a resistor 72.

FIG. 5A shows a block diagram of the switching unit 1 according to the invention for a probe of an oscilloscope and explains in this context the input circuitry of the switching matrix 2. The first, second and third inputs $6_1$, $6_2$, $6_3$ at which the input signals A, B, C are supplied to the switching matrix 2 are clearly evident. In this context, a first input signal A is supplied to the switching matrix 2 at a first input $6_1$ via a first parallel circuit $80_1$ comprising a first capacitor $81_1$ and a first amplifier arrangement $82_1$. A resistor $83_1$ can also be connected in series to the first capacitor $81_1$. The parallel circuit $80_1$ is contacted via a connection line $84_1$ and a resistor $85_1$ with the circuit to be measured.

Furthermore, a second input signal B is supplied to the switching matrix 2 at a second input $6_2$ via a second parallel circuit $80_2$ comprising a second capacitor $81_2$ and a second amplifier arrangement $82_2$. A resistor $83_2$ is also connected to the second capacitor $81_2$. The second parallel circuit $80_2$ is contacted with the circuit to be measured via a line $84_2$ and a resistor $85_2$. A third input $6_3$ of the switching matrix 2 is preferably connected to the reference ground. The reference ground also relates to the reference potential.

The line $84_1$ is provided with a broadband termination via the resistor $83_1$. The line $84_2$ is provided with a broadband termination via the resistor $83_2$. A high-frequency signal which is supplied to the switching unit 1 via the resistor $85_1$ is transferred via the first capacitor $81_1$ and the resistor $83_1$ to the first input $6_1$ of the switching matrix 2. A low-frequency signal which is supplied via the resistor $85_1$ to the switching unit 1, is transferred via the first amplifier arrangement $82_1$ to the first input $6_1$ of the switching matrix 2. A high-frequency signal, which is supplied to the resistor $85_2$, is supplied via the second capacitor $81_2$ to the second input $6_2$ of the switching matrix 2. A low-frequency signal which is supplied to the resistor $85_2$ is transferred via the second amplifier arrangement $82_2$ to the second input $6_2$ of the switching matrix 2.

FIG. 5B shows a block diagram of a first amplifier arrangement $82_1$ for the input circuitry of the switching matrix 2. The first amplifier arrangement $82_1$ comprises a first amplifier $90_1$ and a first resistive voltage splitter $91_1$, which is arranged upstream of the input of the first amplifier $90_1$. The first resistive voltage splitter comprises the resistors $92_1$ and $92_2$. Furthermore, the first amplifier arrangement $82_1$ provides a third capacitor $93_1$, whereas the third capacitor $93_1$ is connected between the resistive voltage splitter $91_1$ and the input of the first amplifier $90_1$ to the reference ground. This third capacitor $93_1$ causes a low-pass characteristic of the arrangement. At the output of the first amplifier $90_1$, a resistor $94_1$ can also be connected in series. In this context, the resistors $92_1$, $92_2$, $94_1$ are dimensioned in such a manner that a low-frequency signal which is guided via the first amplifier arrangement $82_1$ provides an equally high amplitude to a high-frequency signal which is guided via the first capacitor $81_1$.

FIG. 5C shows a further block diagram of a second amplifier arrangement $82_2$, which presents the input circuitry of the switching matrix 2. The second amplifier arrangement $82_2$ provides a second amplifier $90_2$ and a second resistive voltage splitter $91_2$. The second amplifier $90_2$ preferably provides a current output (trans-admittance amplifier). The second resistive voltage splitter $91_2$ is arranged upstream of the input of the second amplifier $90_2$. The second amplifier arrangement $82_2$ further provides a fourth capacitor $93_2$, whereas the fourth capacitor $93_2$ is connected between the second resistive voltage splitter $91_2$ and the input of the second amplifier $90_2$ to the reference ground. The resistors $92_3$, $92_4$ of the resistive voltage splitter $91_2$ are dimensioned in such a manner that a low-frequency signal which flows via the second amplifier arrangement $82_2$, provides an equally large amplitude to a high-frequency signal which flows via the second capacitor $81_2$.

In general, the collector terminals of the transistors connected to the reference ground can also be connected to a supply voltage or another, preferably low-ohmic node outside the signal path. Otherwise, it is emphasised that all of the voltages in the Tables are selected only by way of example and other voltages can also be set.

Within the scope of the invention, all of the features described and/or illustrated and/or claimed can be combined with one another. All connections relate to electrically conducting connections unless otherwise described. It will be obvious to those having skill in the art that many changes may be made to the details of the above-described embodiments of this invention without departing from the underlying principles thereof.

What is claimed is:

1. A switching unit for the arithmetic linking of at least two input signals supplied to the switching unit, comprising:
    a switching matrix to which the at least two input signals are supplied,
    wherein the switching matrix applies at least one summation operation to at least two input signals, applies at least one multiplication operation to at least one input signal of the at least two input signals, or connects the at least one input signal of the at least two input signals directly through to a first output,
    wherein the switching matrix includes several current switches,
    wherein a current switch includes a first input, a second input, a third input, a first output, and a second output,
    wherein the current switch includes a first transistor and a second transistor,
    wherein the first and second transistors are connected at their emitter terminals or source terminals to one another and to the first input of the current switch,
    wherein a base terminal or a gate terminal of the first transistor is connected to the second input of the current switch,
    wherein a base terminal or a gate terminal of the second transistor is connected to the third input of the current switch,
    wherein a control voltage is applied to the second and third inputs of the current switch,
    wherein a collector terminal or a drain terminal of the first transistor is connected to the first output of the current switch, and
    wherein a collector terminal or a drain terminal of the second transistor is connected to the second output of the current switch.

2. The switching unit according to claim 1, wherein the switching matrix includes a second output,
    wherein the switching unit includes a single difference-forming element, and
    wherein the single difference-forming element is connected to the first and second outputs of the switching matrix.

3. The switching unit according to claim 2, wherein the first output of the switching matrix is connected to a first input of the difference-forming element and the second output of the switching matrix is connected to a second input of the difference-forming element via a buffer stage, thereby reducing output-end capacitance of the switching matrix for the difference-forming element.

4. The switching unit according to claim 2, wherein a first input signal of the at least two input signals, a second input signal of the at least two input signals, and a third input signal of the at least two input signals are supplied to the switching matrix, and
    wherein the switching matrix together with the single difference-forming element calculates at least one of arithmetic links A-C, arithmetic links B-C, arithmetic links A-B, and arithmetic links A/2+B/2−C, or all of the input signals relate to an input current.

5. The switching unit according to claim 2, wherein the current switches include transistor current switches, or
    wherein the single difference-forming element relates to at least one of a single difference amplifier, a transimpedance stage, or a current-balancing circuit.

6. The switching unit according to claim 1, wherein a multiplication circuit for multiplication of an input signal of the at least two input signals by a constant factor includes a current switch of the several current switches, of which the control voltage provides a value of approximately 0 V or a multiplication circuit for multiplication of an input signal by a constant factor of 0 to 1 includes two current switches arranged in parallel,
    wherein first inputs of the two current switches are connected to one another to form a common input,
    wherein second inputs of the two current switches are connected to one another, wherein third inputs of the two current switches are connected to one another,
wherein the control voltage is present at the second and third inputs of the two current switches,
wherein the first outputs of the two current switches are connected to one another to form a common first output, and
wherein a second output of a first current switch of the two current switches of the multiplication circuit is connected to a reference ground, and
wherein a second output of a second current switch of the two current switches of the multiplication circuit forms a second output of the multiplication circuit.

7. The switching unit according to claim 6,
wherein a first input signal is supplied to the first current switch at its first input, a first output of the first current switch is connected to a common input of a first multiplication circuit, and a common first output and a second output of the first multiplication circuit are connected to a first input of a difference-forming element,
wherein the second output of the first current switch is connected to a first input of the second current switch, a first output of the second current switch is connected to the first input of the difference-forming element, and the second output of the second current switch is connected to the reference ground,
wherein a second input signal is supplied to a third current switch of the several current switches at its first input, a first output of the third current switch is connected to a common input of a second multiplication circuit, a common first output of the second multiplication circuit is connected to a second input of the difference-forming element, and a second output of the second multiplication circuit is connected to the first input of the difference-forming element,
wherein a second output of the third current switch is connected to a first input of a fourth current switch of the several current switches, a first output of the fourth current switch is connected to the reference ground, and a second output of the fourth current switch is connected to the first input of the difference-forming element, or
wherein a third input signal is supplied to a fifth current switch of the several current switches at its first input, a first output of the fifth current switch is connected to the reference ground, and a second output of the fifth current switch is connected to the second input of the difference-forming element.

8. The switching unit according to claim 6,
wherein a first input signal is supplied to the first current switch at its first input, a first output of the first current switch is connected to a first input of a difference-forming element, the second output of the first current switch is connected to a first input of the second current switch, the first output of the second current switch is connected to the first input of the difference-forming element, the second output of the second current switch is connected to a common input of a first multiplication circuit, a common first output of the first multiplication circuit is connected to the reference ground, and a second output of the first multiplication circuit is connected to the first input of the difference-forming element,
wherein a second input signal is supplied to a third current switch of the several current switches at its first input, a first output of the third current switch is connected to a second input of the difference-forming element, a second output of the third current switch is connected to a first input of a fourth current switch, a first output of the fourth current switch of the several current switches is connected to the first input of the difference-forming element, and a second output of the fourth current switch is connected to the common input of the first multiplication circuit, or
wherein a third input signal is supplied to a fifth current switch of the several current switches at its first input, a first output of the fifth current switch is connected to the reference ground, and a second output of the fifth current switch is connected to the second input of the difference-forming element.

9. The switching unit according to claim 6,
wherein a third input signal is supplied to the first current switch at its first input, a first output of the first current switch is connected to a second input of a difference-forming element, and the second output of the first current switch is connected to the reference ground,
wherein the first input signal of the at least two input signals is connected via a third transistor to a first input of the difference-forming element, the first input signal is connected via a first multiplication circuit to the first input of the difference-forming element, and the first input signal is connected via a fourth transistor to the reference ground, or
wherein the second input signal of the at least two input signals is connected via a fifth transistor to the second input of the difference-forming element, the second input signal is connected via a sixth transistor to the first input of the difference-forming element, the second input signal is connected via a seventh transistor to the reference ground, and the second input signal is connected via a second multiplication circuit to the first input of the difference-forming element.

10. The switching unit according to claim 1,
wherein a first input signal of the at least two input signals is supplied to the first and second transistors at their emitter terminals, the first transistor is connected to a first input of a first current switch of the several current switches, and a third transistor is connected to a first input of a second current switch of the several current switches,
wherein a second input signal of the at least two input signals is supplied to the first and second transistors at their emitter terminals, a fourth transistor is connected to the first input of the first current switch, and a sixth transistor is connected to the first input of the second current switch, or
wherein a third input signal of the at least two input signals is supplied to the first and second transistors at their emitter terminals, a seventh transistor is connected to the first input of the first current switch, and a ninth transistor is connected to the first input of the second current switch.

11. The switching unit according to claim 10,
wherein the first input signal is supplied to the second transistor which is connected to a reference ground,
wherein the second input signal is supplied to a fifth transistor which is connected to the reference ground,
wherein the third input signal is supplied to an eighth transistor, which is connected to the reference ground,
wherein a first output of the first current switch and a first output of the second current switch is connected to the reference ground,
wherein a second output of the first current switch is connected to a first input of a difference-forming element, or wherein a second output of the second current switch is connected to a second input of the difference-forming element.

12. The switching unit according to claim 1,
wherein a first input signal of the at least two input signals is supplied to the switching matrix at a first input via a first parallel circuit including a first capacitor and a first amplifier arrangement, or
wherein a second input signal of the at least two input signals is supplied to the switching matrix at a second input via a second parallel circuit including a second capacitor and a second amplifier arrangement.

13. The switching unit according to claim 12,
wherein the first amplifier arrangement includes a first amplifier and a first resistive voltage splitter, wherein the first resistive voltage splitter is arranged upstream of an input of the first amplifier,
wherein the second amplifier arrangement includes a second amplifier and a second resistive voltage splitter, wherein the second resistive voltage splitter is arranged upstream of an input of the second amplifier, or
wherein the second amplifier includes a current output.

14. The switching unit according to claim 13,
wherein the first amplifier arrangement includes a third capacitor, the third capacitor is connected between the first resistive voltage splitter, and the input of the first amplifier to a reference ground,
wherein the first amplifier arrangement includes a first resistor which is connected in series to the output of the first amplifier, or
wherein the second amplifier arrangement includes a fourth capacitor, wherein the fourth capacitor is connected between the second resistive voltage splitter and the input of the second amplifier to the reference ground.

15. The switching unit according to claim 12,
wherein the first parallel circuit also includes a third resistor, which is connected in series to the first capacitor, or
wherein the second parallel circuit also includes a fourth resistor which is connected in series to the second capacitor.

16. The switching unit according to claim 2,
wherein a first input signal of the at least two input signals is supplied to a first current switch of the several current switches at its first input, a first output of the first current switch is connected to a common input of a first multiplication circuit, and a common first output and a second output of the first multiplication circuit are connected to a first input of the single difference-forming element,
wherein a second output of the first current switch is connected to a first input of a second current switch of the several current switches, a first output of the second current switch is connected to the first input of the difference-forming element, and a second output of the second current switch is connected to a reference ground,
wherein a second input signal of the at least two input signals is supplied to a third current switch of the several current switches at its first input, a first output of the third current switch is connected to a common input of a second multiplication circuit, a common first output of the second multiplication circuit is connected to a second input of the difference-forming element, and a second output of the second multiplication circuit is connected to the first input of the difference-forming element,
wherein a second output of the third current switch is connected to a first input of a fourth current switch of the several current switches, a first output of the fourth current switch is connected to the reference ground, and a second output of the fourth current switch is connected to the first input of the difference-forming element, or
wherein a third input signal is supplied to a fifth current switch of the several current switches at its first input, a first output of the fifth current switch is connected to the reference ground, and a second output of the fifth current switch is connected to the second input of the difference-forming element.

17. The switching unit according to claim 2,
wherein a first input signal of the at least two input signals is supplied to a first current switch of the several current switches at its first input, a first output of the first current switch is connected to a first input of the difference-forming element, a second output of the first current switch is connected to a first input of a second current switch of the several current switches, a first output of the second current switch is connected to the first input of the difference-forming element, a second output of the second current switch is connected to a common input of a first multiplication circuit, a common first output of the first multiplication circuit is connected to a reference ground, and a second output of the first multiplication circuit is connected to the first input of the difference-forming element,
wherein a second input signal of the at least two input signals is supplied to a third current switch at its first input, a first output of the third current switch is connected to a second input of the difference-forming element, a second output of the third current switch is connected to a first input of a fourth current switch of the several current switches, a first output of the fourth current switch is connected to the first input of the difference-forming element, and a second output of the fourth current switch is connected to the common input of the first multiplication circuit, or
wherein a third input signal of the at least two input signals is supplied to a fifth current switch at its first input, a first output of the fifth current switch is connected to the reference ground, and a second output of the fifth current switch is connected to the second input of the difference-forming element.

18. The switching unit according to claim 2,
wherein a first input signal of the at least two input signals is present in a second transistor which is connected to a reference ground,
wherein a second input signal of the at least two input signals is present in a fifth transistor which is connected to the reference ground,
wherein a third input signal of the at least two input signals is present in an eighth transistor, which is connected to the reference ground,
wherein a first output of a first current switch of the several current switches and a first output of a second current switch of the several current switches is connected to the reference ground,
wherein a second output of the first current switch is connected to a first input of the difference-forming element, or
wherein a second output of the second current switch is connected to a second input of the difference-forming element.

19. The switching unit according to claim 2,
wherein a third input signal of the at least two input signals is supplied to a first current switch of the several current switches at its first input, a first output of the first current switch is connected to a second input of the difference-forming element, and a second output of the first current switch is connected to a reference ground, wherein a first input signal of the at least two input signals is connected via a third transistor to a first input of the difference-forming element, the first input signal is connected via a first multiplication circuit to the first input of the difference-forming element, and the first input signal is connected via a fourth transistor to the reference ground, or wherein a second input signal is connected via a fifth transistor to the second input of the difference-forming element, the second input signal of the at least two input signals is connected via a sixth transistor to the first input of the difference-forming element, the second input signal is connected via a seventh transistor to the reference ground, and the second input signal is connected via a second multiplication circuit to the first input of the difference-forming element.

20. A probe for an oscilloscope providing a switching unit according to claim 1.

* * * * *